US008766648B2

(12) United States Patent
Kikuchi et al.

(10) Patent No.: US 8,766,648 B2
(45) Date of Patent: Jul. 1, 2014

(54) METHOD AND SYSTEM FOR DETERMINING AN OPERATING CHARACTERISTIC ASSOCIATED WITH AN INDUCTOR IN A POWER CONVERTER SYSTEM

(75) Inventors: Jun Kikuchi, Northville, MI (US); Chingchi Chen, Ann Arbor, MI (US); Michael W. Degner, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 676 days.

(21) Appl. No.: 12/916,981

(22) Filed: Nov. 1, 2010

(65) Prior Publication Data
US 2012/0105078 A1    May 3, 2012

(51) Int. Cl.
*G01R 27/28* (2006.01)
*H02M 3/156* (2006.01)

(52) U.S. Cl.
CPC .................... *H02M 3/156* (2013.01)
USPC ....................................... 324/654

(58) Field of Classification Search
CPC .................................... H02M 3/156
USPC ............. 324/654, 771; 307/10.1; 903/930; 320/109, 111, 138, 140, 145, 103, 104, 320/127, 134, 149
See application file for complete search history.

(56) References Cited

U.S. PATENT DOCUMENTS

| | | | |
|---|---|---|---|
| 6,507,506 B1 * | 1/2003 | Pinas et al. | 363/79 |
| 6,630,810 B2 * | 10/2003 | Takemasa et al. | 320/104 |
| 6,946,818 B2 | 9/2005 | Cawthorne et al. | |
| 7,521,899 B2 * | 4/2009 | Matvieshen | 320/166 |
| 7,607,499 B2 * | 10/2009 | Egami | 180/65.265 |
| 2008/0246508 A1 * | 10/2008 | Wang et al. | 324/771 |
| 2009/0103341 A1 * | 4/2009 | Lee et al. | 363/124 |
| 2009/0212626 A1 * | 8/2009 | Snyder et al. | 307/10.1 |

FOREIGN PATENT DOCUMENTS

WO    0184697 A2    11/2001

OTHER PUBLICATIONS

Amrei, Seyed Reza Hadian Et Ak, A Novel Sensorless Sliding Mode Control Strategy for DC to Dc Converters: Analysis, Modeling and Simulation, IEEE Vehicle Power and Propulsion Conference, Sep. 3-5, 2008, Harbin, China, pp. 1-4.

* cited by examiner

*Primary Examiner* — Amy He
(74) *Attorney, Agent, or Firm* — David B. Kelley; Brooks Kushman P.C.

(57) ABSTRACT

A method and system is provided for determining at least one operating characteristic associated with an inductor in a power converter system. The operating characteristic may be current through the inductor. The power converter system may be of the type used in a hybrid electric vehicle (HEV) to convert electric power from a high-voltage traction battery to drive an electric motor and/or a generator in the HEV.

20 Claims, 5 Drawing Sheets

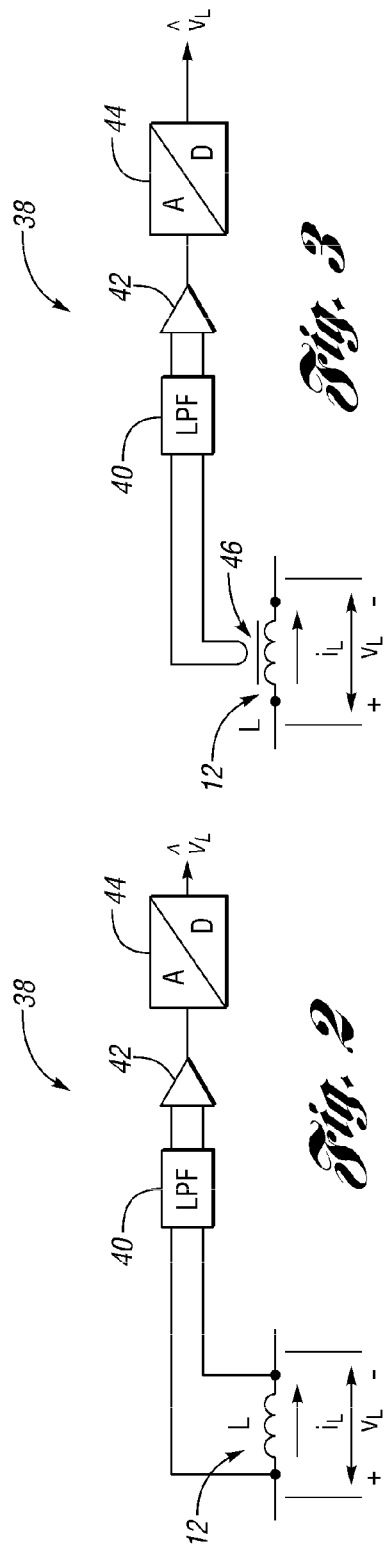
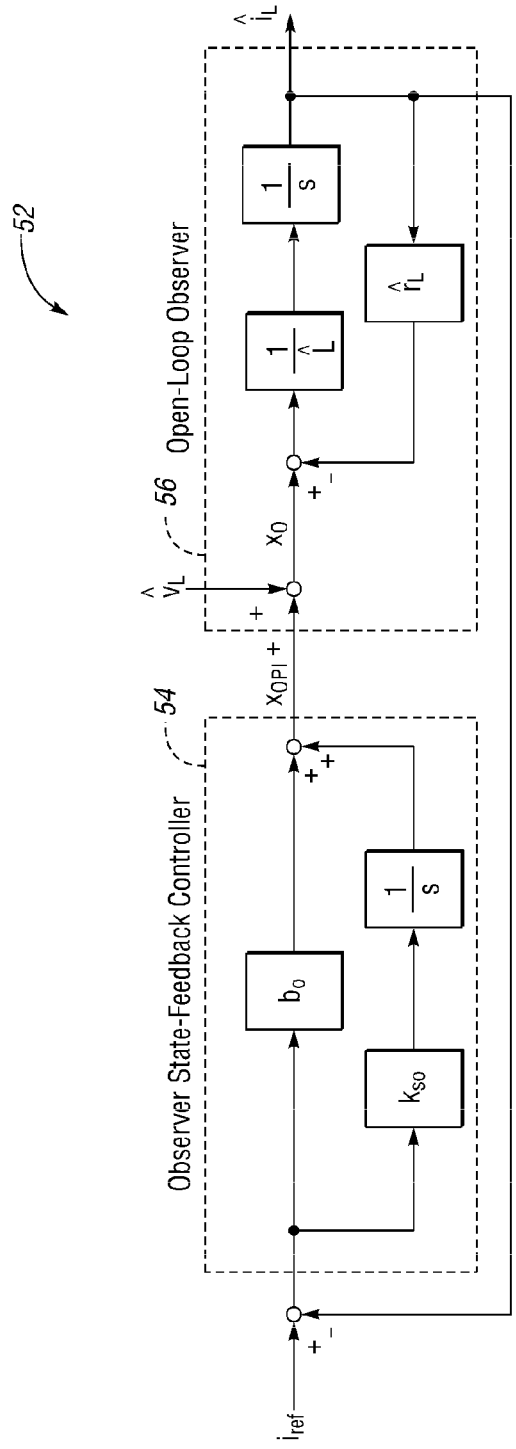

ABSTRACT# METHOD AND SYSTEM FOR DETERMINING AN OPERATING CHARACTERISTIC ASSOCIATED WITH AN INDUCTOR IN A POWER CONVERTER SYSTEM

BACKGROUND

1. Technical Field

Methods and systems for power converter systems, such as of the type used in a hybrid electric vehicle to convert electric power from a high-voltage traction battery to drive an electric motor and/or a generator in the vehicle.

2. Background Art

A hybrid electric vehicle (HEV) generally includes a high-voltage storage battery, a DC-to-DC power converter, an electric motor, a generator, and DC-to-AC power converters (inverters). For example, the HEV may be a series hybrid electric vehicle (SHEV), a parallel hybrid electrical vehicle, or a parallel/series hybrid electric vehicle (PSHEV). In operation, the DC-to-DC power converter can convert electric power from the storage battery into a more suitable form of power to drive the electric motor and/or the generator in the HEV. For example, the power converter may boost DC voltage from the high-voltage storage battery to a desired voltage value for driving the electric motor and/or the generator.

The DC-to-DC power converter in the HEV typically includes an inductor and a corresponding current sensor. In operation, the current sensor senses current flow through the inductor. However, the current sensor may increase the cost and size of the power converter. Thus, it may be desirable or necessary to have a power converter system without an inductor current sensor.

Regarding the hat notation (^) used and illustrated herein, it should be understood that a symbol followed by ^ (e.g., $v\hat{}_L$ or $i\hat{}_L$) refers to a ^ above that symbol. For example, $v\hat{}_L$ and $i\hat{}_L$ respectively refer to $\hat{v}_L$ and $\hat{i}_L$.

SUMMARY

A method and system is provided for determining at least one operating characteristic associated with an inductor in a power converter system. For example, the operating characteristic associated with the inductor may be current through the inductor. The operating characteristic is based on current from the storage side ($i_{ref}$) as well as an electrical non-current parameter of the inductor obtained during operation of the power converter system. The current from the storage side ($i_{ref}$) may be based on battery output current ($i_{batt}$) from a storage battery connected to a storage side of the power converter system. Furthermore, the electrical non-current parameter of the inductor may be based on the voltage across the inductor ($v_L$).

A capacitor may be connected to the storage side of the power converter system. The voltage across the inductor ($v_L$) may be determined based on the voltage across the capacitor ($v_{in}$), a duty cycle of a power switch in the power converter system ($d_{top}$), and a bus voltage ($v_{DC}$). In another example, the voltage across the inductor ($v_L$) may be determined based on a filtered voltage measurement across the inductor. The filtered voltage measurement may be converted to digital form. Inductive coupling sensing of the inductor may be used to obtain the voltage measurement across the inductor.

The current through the inductor ($i\hat{}_L$) may be determined based on feedback from an open-loop observer portion. The feedback from the open-loop observer portion may be based on estimated inductor (L^) of the inductor, estimated parasitic resistance of the inductor ($r\hat{}_L$) and the measured or estimated voltage across the inductor ($v\hat{}_L$). Furthermore, the current through the inductor ($i\hat{}_L$) may be based on a difference between the feedback and the reference current ($i_{ref}$). The reference current ($i_{ref}$) may be based on the battery output current ($i\hat{}_{batt}$) and estimated or measured parasitic/auxiliary load current ($i\hat{}_{AUX}$). For example, proportional integral control of the difference between the reference current ($i_{ref}$) and the feedback from the open-loop observer may be used to determine the current through the inductor ($i\hat{}_L$). The proportional integral control may be based on inductance of the inductor and parasitic resistance in the inductor. The battery output current ($i_{batt}$) may be based on current from the traction battery.

BRIEF DESCRIPTION OF THE DRAWINGS

FIG. 2 is a schematic diagram illustrating a circuit element of the DC-to-DC power converter system including a low pass filter, an amplifier, and an analog-to-digital converter to determine voltage across the inductor ($v_L$) in accordance with one embodiment;

FIG. 3 is a schematic diagram similar to FIG. 2, but illustrating the circuit element including an inductive coupling sensor for measuring voltage across the inductor;

FIG. 4 is a block diagram illustrating a method of determining inductor current ($i\hat{}_L$) in the DC-to-DC power converter system in accordance with one embodiment;

DETAILED DESCRIPTION

Embodiments of the present disclosure include a method and system for determining at least one operating characteristic associated with an inductor in a power converter system, such as of the type used in a hybrid electric vehicle (HEV) to convert electric power from a high-voltage traction battery to drive an electric motor and/or a generator in the vehicle. The method and system may determine the operating characteristic associated with the inductor as current through the inductor.

As those of ordinary skill in the art will understand, various features of the embodiments illustrated and described with reference to any one of the Figures may be combined with features illustrated in one or more other Figures to produce alternative embodiments that are not explicitly illustrated or described. The combinations of features illustrated provide representative embodiments for typical applications. However, various combinations and modifications of the features consistent with the teachings of the present disclosure may be desired for particular applications or implementations.

Figure 1:
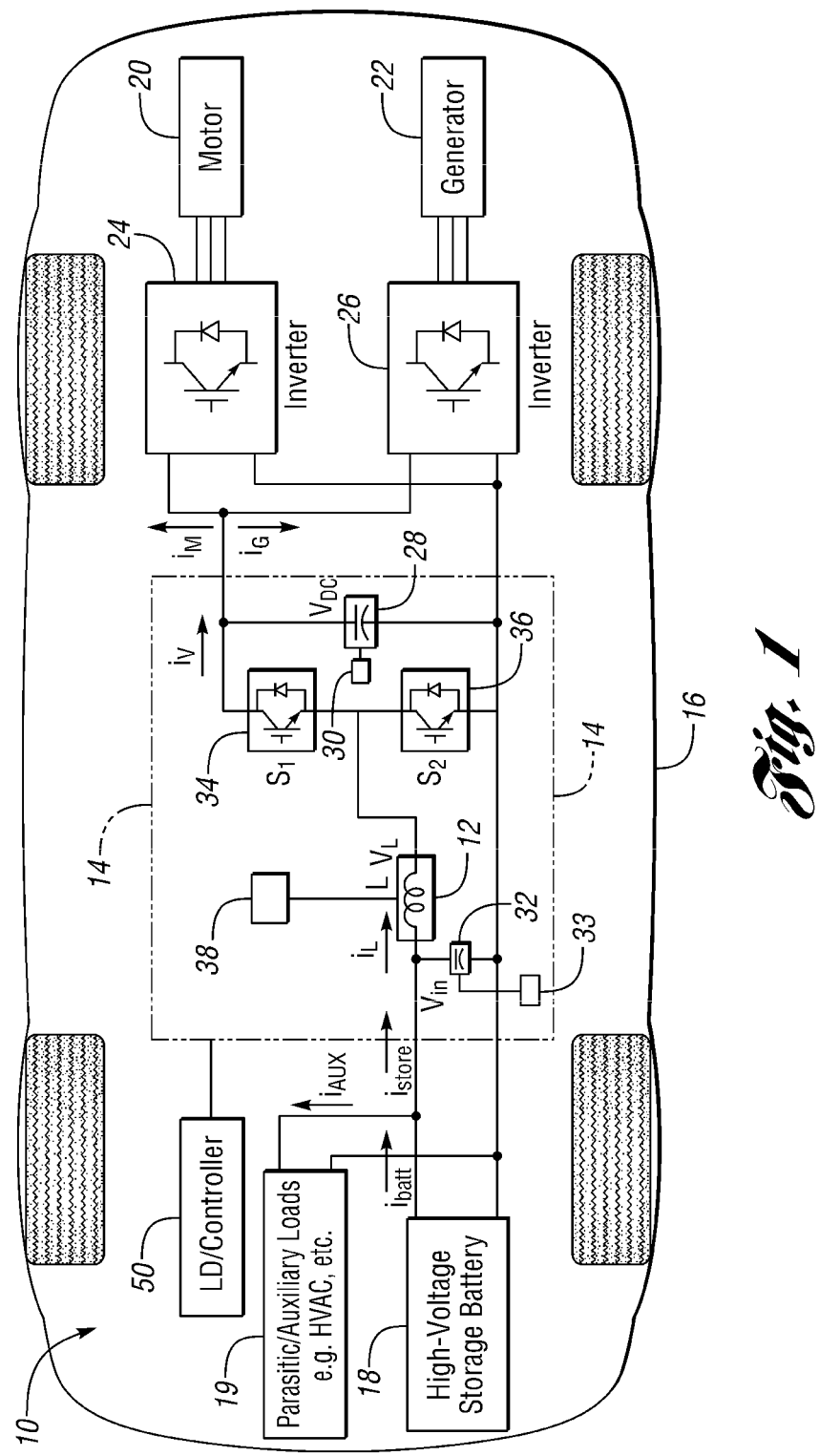
FIG. 1 is a schematic diagram illustrating a hybrid electric vehicle (HEV) including a DC-to-DC power converter system with an inductor as well as a system for determining at least one operating characteristic associated with the inductor in accordance with one embodiment.

With reference to FIG. 1, a system 10 is provided for determining at least one operating characteristic associated with an inductor 12 in a DC-to-DC power converter system 14. The DC-to-DC power converter system 14 of FIG. 1 is shown in a hybrid electric vehicle (HEV) 16 with a powertrain of a parallel/series hybrid electric vehicle (PSHEV). However, the DC-to-DC power converter system 14 may be integrated with other powertrain configurations, such as a series hybrid electric vehicle (SHEV) and a parallel hybrid electric vehicle. The HEV 16 may be a plug-in hybrid electric vehicle, a hybrid fuel cell electric vehicle (FCEV), or battery-replacement electric vehicle. The system 10 and its method of operation are described in a general fashion to facilitate understanding of various aspects of the system 10 and method.

The inductor 12 of FIG. 1 is shown to include inductance L, which varies with the current flow through the inductor 12. The inductor 12 has parasitic resistance "$r_L$", which varies with the temperature of the inductor 12. The current flow through the inductor 12 is labeled "$i_L$" and may be referred to as inductor current. The voltage across the inductor 12 is labeled "$v_L$" and may be referred to as inductor voltage.

As illustrated in FIG. 1, the HEV 16 includes a high-voltage traction battery 18 (hereinafter "HV battery"). The HV battery 18 outputs or stores electrical power at a high-voltage, such as 300 volts. In one example, the HV battery 18 may be a lithium ion battery that has a plurality of lithium ion cells. The cells in the HV battery 18 can be connected in series to provide a high-voltage output of 300 volts.

With continuing reference to FIG. 1, the HEV 16 includes an electric motor 20 and an electric generator 22. The electric motor 20 and the electric generator 22 are two electric machines that make up an electric machine arrangement. Thus, the motor 20 and the electric generator 22 each represent a portion of the electric machine arrangement. However, the system 10 may be connected to different electric machine arrangements, such as more or fewer than two electric machines.

The electric motor 20 of FIG. 1 may be a three-phase permanent-magnet synchronous motor (PMSM). The electric motor 20 may operate as a motor to drive the drive wheels in the HEV 16 and to propel the HEV 16. In addition, the electric motor 20 may operate as a generator to provide electric power to operate the HEV 16 or both as a generator and motor. In operation, the electric generator 22 generates electric power to charge the HV battery 18 or to distribute electric power from the HV battery 18 to the electric motor 20 or other electric device in the HEV 16. For example, the electric generator 22 may be connected to a sun gear of a planetary gear set (not shown) in the HEV 16 to convert mechanical power from the sun gear into electrical power for the HEV 16.

As shown in FIG. 1, the DC-to-DC power converter system 14 is disposed between the HV battery 18 and the electric machine arrangement (i.e., the electric motor 20 and the generator 22). The DC-to-DC power converter system 14 has a storage side and a bus side. The HV battery 18 is electrically connected to the storage side of the DC-to-DC power converter system 14. Both the electric motor 20 and generator 22 are connected to the bus side of the DC-to-DC power converter system 14. In operation, the DC-to-DC power converter system 14 effects power transfer from the storage side to the bus side. The DC-to-DC power converter system 14 may also transfer electric power from the bus side to the storage side depending on the configuration of the system 10 and operating conditions. "$i_{store}$" (shown in FIG. 1) represents current flow into the storage side of the DC-to-DC power converter system 14. For example, $i_{store}$ may correspond to the difference between battery output current ($i_{batt}$) from the HV battery 18 and Parasitic/Auxiliary load current ($i_{AUX}$) flowing into the Parasitic/Auxiliary loads 19.

Operation of the power converter system 14 may be subjected to one or more parasitic/auxiliary loads, which is generally referenced in FIG. 1 by reference numeral 19. Current associated with the parasitic/auxiliary load 19 is referred to as parasitic/auxiliary load current ($i_{AUX}$). The parasitic/auxiliary load current ($i_{AUX}$) represents current branching off to various loads, such as a Heating, Ventilating, and Air Conditioning (HVAC) in HEV 16. The parasitic/auxiliary load current ($i_{AUX}$) may be determined based on existing measurements and/or known load characteristics of such parasitic/auxiliary loads.

As illustrated in FIG. 1, the HEV 16 includes a motor inverter 24 and a generator inverter 26. The motor inverter 24 electrically connects the electric motor 20 to the bus side of the DC-to-DC power converter system 14 and drives the electric motor 20. Similarly, the generator inverter 26 electrically connects the electric generator 22 to the bus side of the DC-to-DC power converter system 14 and drives the electric generator 22. The motor and generator inverters 24, 26 may operate as DC-to-AC converters. In such an example, the motor and generator inverters 24, 26 may receive DC power from the DC bus or bus side of the DC-to-DC power converter system 14 and convert the DC power to AC power for driving respective electric machines 20, 22. "$i_M$" in FIG. 1 represents current flow from the bus side of the power converter system 14 to the motor inverter 24. Likewise, "$i_G$" represents current flow from the bus side of the power converter system 14 to the generator inverter 26. The inverters 24, 26 of FIG. 1 are shown separate from the DC-to-DC power converter system 14. However, the inverters 24, 26 may be integrated as part of the power converter system 14.

The motor inverter 24 of FIG. 1 may be a three-phase DC-to-AC converter to selectively drive the electric motor 20 with three-phase AC power. Similarly, the generator inverter 26 may be a three-phase DC-to-AC converter to selectively drive the electric generator 22 with three-phase AC power. In such examples, the DC-to-DC power converter system 14 of FIG. 1 can convert high-voltage DC electric power from the HV battery 18 to another suitable form of DC power for the electric motor 20, for the generator 22, or for both electric machines 20, 22. Thus, the DC-to-DC power converter system 14 may be considered to be a variable voltage controller.

As depicted in FIG. 1, the DC-to-DC power converter system 14 may include a direct current (DC)-bus capacitor 28. Both the motor and generator inverters 24, 26 are connected to the DC-bus capacitor 28. The DC-bus capacitor 28 may, for example, reduce ripple current flowing through the bus side of the DC-to-DC power converter system 14. The DC-bus capacitor 28 of FIG. 1 is shown integrated as part of the DC-to-DC power converter system 14. However, the DC-bus capacitor 28 may be separate from the DC-to-DC power converter system 14 and electrically connected to the bus side of the power converter system 14. A circuit 30, such as voltage sensor, can sense or measure a voltage across the DC-bus capacitor 28 ($v_{Dc}$) to obtain the DC-bus voltage ($\hat{v}_{DC}$), which may be a voltage measurement.

As illustrated in FIG. 1, the DC-to-DC power converter system 14 may include a direct current (DC)-input capacitor 32. The DC-input capacitor 32 is electrically coupled between the HV battery 18 and the storage side of the DC-to-DC power converter system 14. The DC-input capacitor 32 of FIG. 1 is shown integrated as part of the DC-to-DC power converter system 14. However, the DC-input capacitor 32 may be separate from the DC-to-DC power converter system 14 and connected to the storage side of the DC-to-DC power converter system 14. A circuit 33, such as voltage sensor, can sense or measure a voltage across the DC-input capacitor 32 ($v_{in}$) to obtain the DC-input voltage ($\hat{v}_{in}$), which may be a voltage measurement.

As shown in FIG. 1, the DC-to-DC power converter system 14 includes power switches 34, 36, which are respectively labeled $S_1$ and $S_2$ in FIG. 1. The power switches 34, 36 ($S_1$ and $S_2$) may be implemented by various types of controllable switches. For example, each power switch may include a diode and a transistor, such as an IGBT. The DC-to-DC power converter system 14 may, for example, operate as a boost converter. If the current through the inductor 12 ($i_L$) is positive, then it flows through the diode of switch 34 ($S_1$) when power switch 36 ($S_2$) is OFF. When power switch 36 ($S_2$) is ON, inductor current ($i_L$) flows through power switch 36 ($S_2$). While the DC-to-DC power converter system 14 is shown to include two power switches ($S_1$ and $S_2$), the power converter system 14 may include any number of power switches depending on the particular configuration of the DC-to-DC power converter system 14 to effect power transfer between the storage side and the bus side of the DC-to-DC power converter system 14.

As shown in FIG. 1, the system 10 may include circuit element 38. Circuit element 38 obtains or determines voltage across the inductor 12. Recall, the voltage across the inductor 12 may be referenced as $v_L$ as shown in FIG. 1. In addition, circuit element 38 may correspond to the hardware portion of FIG. 5.

As illustrated in FIG. 2, the circuit element 38 may include a low pass filter 40, an amplifier 42, and an analog-to-digital converter 44. The circuit element 38 senses or measures voltage across the inductor 12 ($V_L$) to obtain measured inductor voltage ($v\hat{}_L$) in digital form. $v\hat{}_L$ represents the output of the analog-to-digital converter 44 as a measured quantity of $v_L$. Note, the symbol ˆ as described and illustrated herein may refer to a measured, sensed, estimated, and/or calculated quantity, which may differ from its actual physical quantity.

FIG. 3 is a schematic diagram similar to FIG. 2, but illustrating the circuit element 38 including an inductive coupling sensor 46 for measuring the voltage across the inductor 12 ($v_L$). Similarly, $v\hat{}_L$ represents the output of the analog-to-digital converter 44 as a measured quantity of $v_L$. Circuit element 38 may or may not exist in the system 10 depending on the configuration of the system 10 or the method.

Referring again to FIG. 1, the system 10 includes a logic device (LD) or controller 50. The controller or LD 50 can be implemented by various types or combinations of electronic devices and/or microprocessor-based computers or controllers. To implement a method of determining at least one operating characteristic associated with the inductor 12 in the power converter system 14, the controller 50 may execute a computer program or algorithm embedded or encoded with the method and stored in volatile and/or persistent memory. Alternatively, logic may be encoded in a logic or gate array stored on one or more integrated circuit chips.

The memory may be computer-readable memory that stores the computer program or algorithm embedded or encoded with the method. The memory may store data or information about the various operating conditions or components in the electric vehicle 16, such as the DC-to-DC power converter system 14. The memory may be part of the controller 50. However, the memory may be positioned in any suitable location in the electric vehicle 16 accessible by the controller 50.

Although the LD or controller 50 is shown as a single hardware device to determine at least one operating characteristic associated with the inductor 12, the controller or LD 50 may also include multiple controllers in the form of multiple hardware devices, or multiple software controllers within one or more hardware devices. Furthermore, the controller 50 may include additional hardware devices or software controllers depending on the DC-to-DC power converter system 14.

The LD or controller 50 is configured to determine at least one operating characteristic associated with the inductor 12 in the DC-to-DC power converter system 14. To implement a method of determining the operating characteristic associated with the inductor 12, the LD or controller 50 may obtain or determine various inputs or parameters as described below. For example, the controller 50 may obtain measured digital voltage level ($v\hat{}_L$) from the circuit element 38 of FIG. 2, the circuit element 38 of FIG. 3, calculate the estimated digital voltage level ($v\hat{}_L$), or a combination thereof.

The controller 50 may calculate the estimated digital voltage level ($v\hat{}_L$) as the DC-input voltage ($v\hat{}_{in}$) minus the product of a duty cycle of the power switch ($S_1$) 34 in the DC-to-DC power converter system ($d_{top}$) and the DC-bus voltage ($v\hat{}_{DC}$) (i.e., $v_L\hat{} = v\hat{}_{in} - (d_{top} * v\hat{}_{DC})$). The duty cycle of the power switch 34 ($S_1$) may be determined as the ratio of the time that switch 34 ($S_1$) is ON per switching period T of switch 34 ($S_1$). Depending on the configuration of the DC-to-DC power converter system 14, the controller 50 may determine the estimated digital voltage level ($v\hat{}_L$) in combination with the output from the circuit element 38, which may be configured according to either FIG. 2 or 3, as a backup in an event of hardware malfunction or failure of the circuit element 38.

With reference to FIG. 4, a block diagram 52 is provided to illustrate a method of determining inductor current ($i_L$) in the power converter system 14 in accordance with one embodiment. The controller 50 can implement the function of block diagram 52 to determine at least one operating characteristic associated with the inductor 12 in the DC-to-DC power converter system 14. The operating characteristic associated with the inductor 12 may be inductor current ($i_L$) or another operating characteristic of the DC-to-DC power converter system 14 that is based on inductor current ($i_L$).

As shown in FIG. 4, the block diagram 52 includes an observer state-feedback controller 54 and an open-loop observer 56 to configure a closed-loop observer. The observer state-feedback controller 54 and the open-loop observer 56 together accommodate the variable nature of inductance (L) and parasitic resistance ($r_L$) of the inductor 12 to determine inductor current ($i_L$) in the DC-to-DC power converter system 14 by forming a closed-loop observer.

The open-loop observer 56 of FIG. 4 emulates the physical behavior of the inductor 12. The physical behavior of the inductor 12 varies during operation of the DC-to-DC power converter system 14. For example, the inductance L of the inductor 12 depends on the inductor current $i_L$. Furthermore, the parasitic resistance $r_L$ in the inductor 12 is a function of the temperature of the inductor 12. Inductance L and parasitic resistance $r_L$ are two parameters that may not be accurate in the open-loop observer 56 in emulating the physical behavior of the inductor 12. Symbol "1/s" represents an integrator in the Laplace domain block-diagram convention. The open-loop observer 56 receives inputs corresponding to the estimated inductor terminal voltage ($v\hat{}_L$) and the output of the observer state-feedback controller 54 ($x_{OPI}$) to determine the inductor current ($i_L$) in the DC-to-DC power converter system 14.

The observer state-feedback controller 54 has two gain parameters: $b_o$ and $k_{so}$. One of the typical ways to determine the values of $b_o$ and $k_{so}$ is that $b_o = 2\pi(f_{bw})(L\hat{})$ and $k_{so} = 2\pi(f_{bw})(r\hat{}_L)$ where $f_{bw}$ is a desired closed-loop observer bandwidth. Symbol "1/s" represents an integrator in the Laplace domain block-diagram convention. The output of the observer state-feedback controller 54 ($x_{OPI}$) is based on inputs corresponding to the estimated and fed back inductor current ($\hat{i}_L$) and the reference current ($i_{ref}$). The reference current ($i_{ref}$) may correspond to $i_{store}$ shown in FIG. 1.

Figure 5:
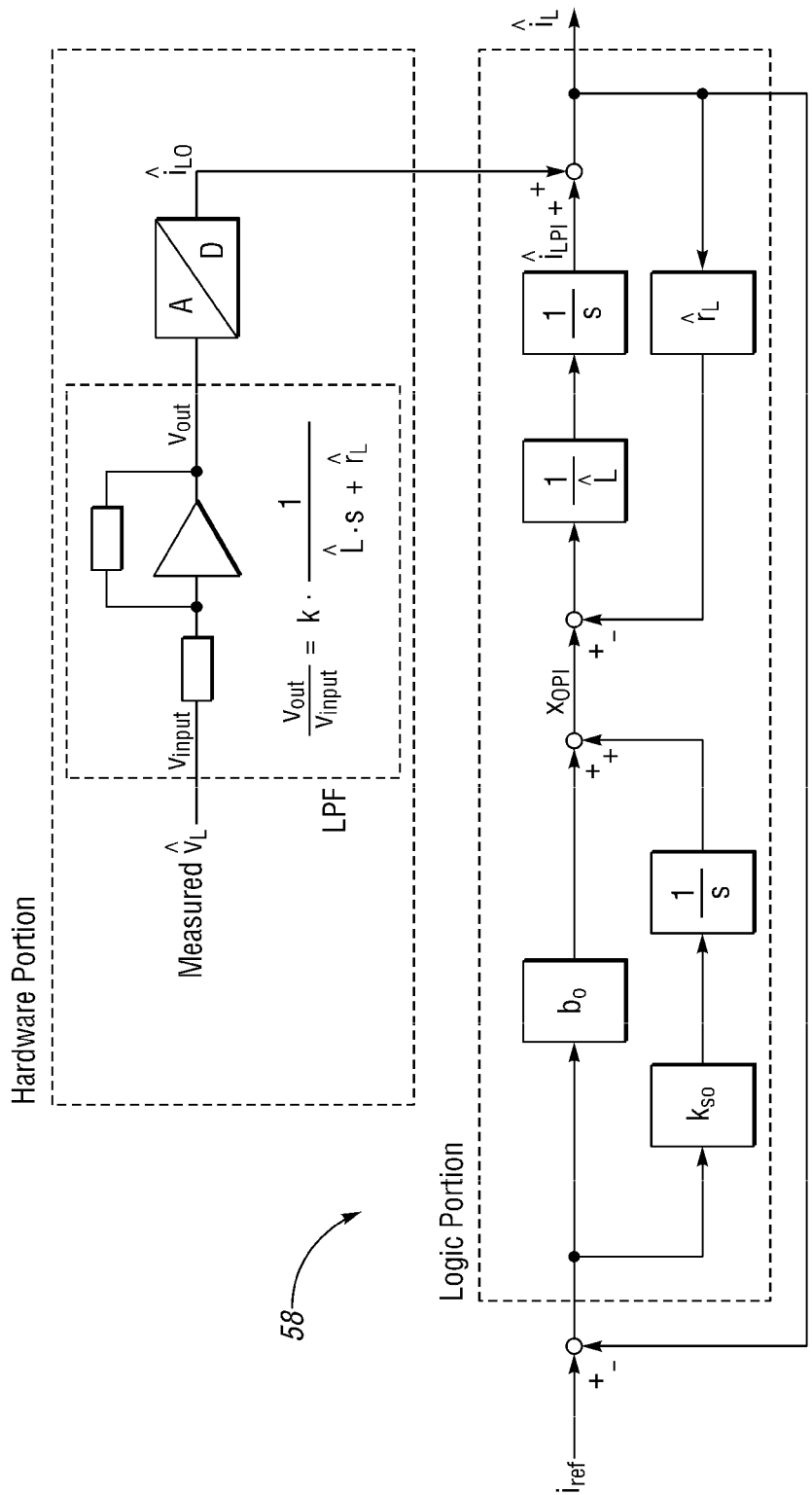
FIG. 5 is a block diagram illustrating a method of determining inductor current ($i\hat{}_L$) in the DC-to-DC power converter system in accordance with another embodiment.

With reference to FIG. 5, a block diagram 58 is provided to illustrate a method of determining inductor current ($i_L$) in the DC-to-DC power converter system 14 in accordance with another embodiment. The controller 50 can implement the function of block diagram 58 to determine at least one operating characteristic associated with the inductor 12 in the DC-to-DC power converter system 14. The operating characteristic associated with the inductor 12 may be inductor current ($i_L$) or another operating characteristic of the DC-to-DC power converter system 14 that is based on inductor current ($i_L$).

As illustrated in FIG. 5, the block diagram 58 has a logic portion that determines the inductor current ($i_L$) in the power converter system 14 based on a proportional integral (PI) portion of estimated inductor current ($\hat{i}_{LPI}$) and an open-loop portion of estimated inductor current ($\hat{i}_{LO}$) from a hardware portion, such as circuit element 38 of FIG. 1. As shown in FIG. 5, a circuit-based low pass filter (LPF) may receive a measured voltage across the inductor 12 ($\hat{v}_L$) and characterize the physical behavior of the inductor 12 as $$\frac{V_{out}}{V_{input}} = k \cdot \frac{1}{\hat{L} \cdot s + \hat{r}_L}$$

prior to the analog-to-digital (A/D) converter of FIG. 5 providing the open-loop portion of estimated inductor current ($\hat{i}_{LO}$) to the logic portion of the block diagram 58. The controller 50 can receive the open-loop portion of estimated inductor current ($\hat{i}_{LO}$) from, for example, circuit element 38 shown in FIG. 1. The logic portion determines the proportional integral portion of estimated inductor current ($\hat{i}_{LPI}$) based on the output of the observer state-feedback controller 54 ($x_{OPI}$) and estimated parameters $\hat{L}$ and $\hat{r}_L$ of the logic portion. The controller 50 can determine estimated inductor current ($\hat{i}_L$) as the sum of $\hat{i}_{LPI}$ and $\hat{i}_{LO}$.

Figure 6:
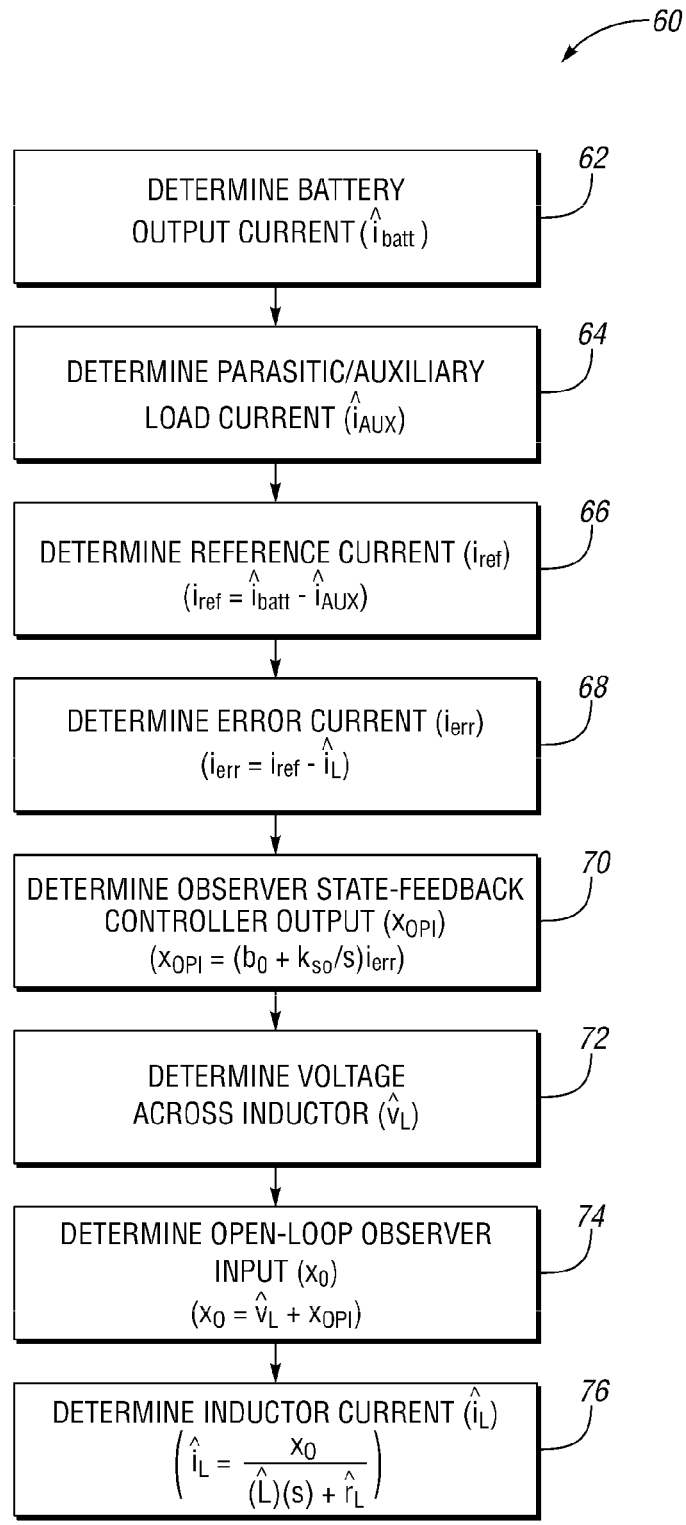
FIG. 6 is a flowchart diagram illustrating a method of determining the inductor current ($i\hat{}_L$) corresponding to FIG. 4 in accordance with one embodiment.

With reference to FIG. 6, a flowchart diagram 60 is provided to illustrate operation of a system or method of determining at least one operating characteristic associated with an inductor in a power converter system, such as the DC-to-DC power converter system 14 illustrated in FIG. 1. The diagram of FIG. 6 provides a representative inductor current estimation scheme for a power converter system as illustrated. The scheme or logic illustrated in FIG. 6 may be implemented by one or more logic arrays and/or a microprocessor based computer or controller. When implemented by a microprocessor based controller, the inductor current estimation scheme may include instructions or code processed using any of a number of known strategies such as event-driven, interrupt-driven, multi-tasking, multi-threading, and the like. Whether implemented primarily in code or hardware devices, various steps or functions illustrated may be performed in the sequence illustrated, in parallel, or in some cases omitted. Although not explicitly illustrated, one of ordinary skill in the art will recognize that one or more of the illustrated functions may be repeatedly performed depending upon the particular implementation. Similarly, the order of processing is not necessarily required to achieve the described features and advantages, but is provided for ease of illustration and description.

The logic may be implemented in software, hardware, or a combination of software and hardware in one or more controllers and/or electronic devices depending upon the particular application. When implemented in software, the logic is preferably provided in one or more computer-readable storage media having stored data representing code or instructions executed by a computer to determine an operating characteristic associated with the inductor 12 in the DC-to-DC power converter system 14. The computer-readable storage media may include one or more of a number of known physical devices which utilize electric, magnetic, optical, and/or hybrid storage to keep executable instructions and associated calibration information, operating variables, and the like.

At block 62 of flowchart diagram 60, a battery output current ($i_{batt}$) from the HV battery 18 is determined. Battery output current ($i_{batt}$) may correspond to $i_{store}$ (illustrated in FIG. 1) if there is no parasitic/auxiliary load. The controller 50 may determine battery output current ($i_{batt}$) based on one or more battery current signals, indicating current flow from the HV battery 18. Battery current sensors in the HEV 16 may provide the battery current signals. Furthermore, the battery current signals may be raw current signals processed by the controller 50 or may be embedded or encoded with data or information about the current flow relative to the HV battery 18.

At block 64, a parasitic/auxiliary load current ($i_{AUX}$) is determined. The parasitic/auxiliary load current ($i_{AUX}$) represents current branching off to various loads, such as a Heating, Ventilating, and Air Conditioning (HVAC) 19 in HEV 16. The controller 50 may determine or calculate the parasitic/auxiliary load current ($i_{AUX}$) based on known load characteristics of such parasitic/auxiliary loads 19 in the HEV 16.

At block 66, a reference current ($i_{ref}$) is determined. The reference current ($i_{ref}$) can be calculated as the difference between the measured or estimated battery output current ($\hat{i}_{batt}$) and the measured or estimated parasitic/auxiliary load current ($\hat{i}_{AUX}$). The controller may determine or calculate the reference current ($i_{ref}$).

At block 68, an error current ($i_{err}$) is determined. The error current ($i_{err}$) can be calculated as the difference between the reference current ($i_{ref}$) and estimated inductor current ($\hat{i}_L$), which may be an output from the open-loop observer portion 56 of FIG. 4. The controller 50 may determine or calculate the error current ($i_{err}$).

At block 70, an output of the observer state-feedback controller ($x_{OPI}$) is determined. The output of the observer state-feedback controller ($x_{OPI}$) can be calculated as $$x_{OPI} = \left(b_0 + \frac{k_{so}}{s}\right)(i_{err}).$$

Gain parameters ($b_o$ and $k_{so}$) may typically be calculated as follows: $b_o = 2\pi(f_{bw})(\hat{L})$ and $k_{so} = 2\pi(f_{bw})(\hat{r}_L)$ where $f_{bw}$ is the desired closed-loop observer bandwidth. The controller may determine or calculate the output of the observer state-feedback controller ($x_{OPI}$).

At block 72 of flowchart diagram 60, inductor voltage ($v_L$) is estimated. The controller 50 may determine the voltage across the inductor 12 based on an output from the circuit element 38. Alternatively, the controller 50 may calculate the estimated digital voltage level ($\hat{v}_L = \hat{v}_{in} - (d_{top} * \hat{v}_{DC})$). Depending on the configuration of the DC-to-DC power converter system 14, the controller 50 may determine the estimated digital voltage level ($\hat{v}_L$) in combination with the output from the circuit element 38, which may be configured according to either FIG. 2 or 3.

At block 74, the input (i.e., $x_o$) to the open-loop observer 56 is determined. Input $x_o$ may be calculated as the sum of the measured or calculated inductor voltage ($\hat{v}_L$) from block 72 and the output of the observer state-feedback controller ($x_{OPI}$) from block 70. The controller 50 may determine or calculate input $x_o$ to the open-loop observer 56 based on $\hat{v}_L$ and $x_{OPI}$.

At block 76, the inductor current ($\hat{i}_L$) in the DC-to-DC power converter system 14 is determined. The open-loop observer 56 may determine the inductor current ($\hat{i}_L$) based on input $x_o$, estimated parasitic resistance $\hat{r}_L$, estimated inductance $\hat{L}$ of the inductor 12, and the so-called "Laplace s" corresponding to the differential operator. For example, the inductor current ($\hat{i}_L$) may be calculated as $$\hat{i}_L = \frac{x_o}{\hat{L} \cdot s + \hat{r}_L}.$$

The controller 50 may determine or calculate the estimated inductor current ($\hat{i}_L$) in the power converter system 14. Based on the estimated inductor current ($\hat{i}_L$), the controller 50 determines at least one operating characteristic associated with the inductor 12 in the power converter system 14. Recall, the operating characteristic associated with the inductor 12 may be inductor current ($i_L$) or another operating characteristic of the power converter system 14 that is based on inductor current ($i_L$).

Figure 7:
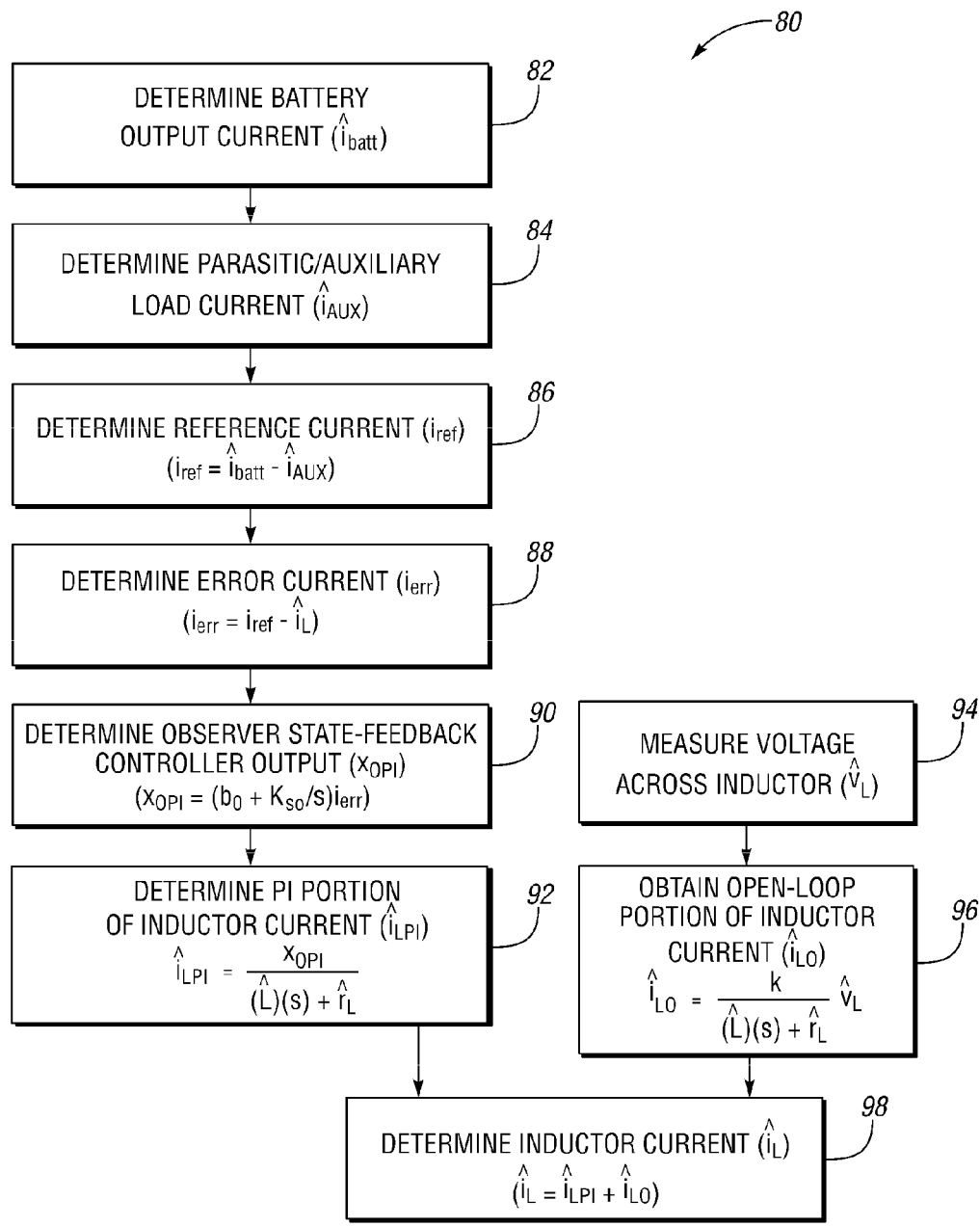
FIG. 7 is a flowchart diagram illustrating a method of determining the inductor current ($i\hat{}_L$) corresponding to FIG. 5 in accordance with one embodiment.

With reference to FIG. 7, a flowchart diagram 80 is provided to illustrate operation of a system or method of determining at least one operating characteristic associated with an inductor in a power converter system, such as the DC-to-DC power converter system 14 illustrated in FIG. 1. The diagram of FIG. 7 provides a representative inductor current estimation scheme for a power converter system as illustrated. The scheme or logic illustrated in FIG. 7 may be implemented by one or more logic arrays and/or a microprocessor based computer or controller. When implemented by a microprocessor based controller, the inductor current estimation scheme may include instructions or code processed using any of a number of known strategies such as event-driven, interrupt-driven, multi-tasking, multi-threading, and the like. Whether implemented primarily in code or hardware devices, various steps or functions illustrated may be performed in the sequence illustrated, in parallel, or in some cases omitted. Although not explicitly illustrated, one of ordinary skill in the art will recognize that one or more of the illustrated functions may be repeatedly performed depending upon the particular implementation. Similarly, the order of processing is not necessarily required to achieve the described features and advantages, but is provided for ease of illustration and description.

The logic may be implemented in software, hardware, or a combination of software and hardware in one or more controllers and/or electronic devices depending upon the particular application. When implemented in software, the logic is preferably provided in one or more computer-readable storage media having stored data representing code or instructions executed by a computer to determine an operating characteristic associated with the inductor 12 in the DC-to-DC power converter system 14. The computer-readable storage media may include one or more of a number of known physical devices which utilize electric, magnetic, optical, and/or hybrid storage to keep executable instructions and associated calibration information, operating variables, and the like.

At block 82 of flowchart diagram 80, a battery output current ($i_{batt}$) from the HV battery 18 is determined. Battery output current ($i_{batt}$) may correspond to $i_{store}$ (illustrated in FIG. 1) if there is no parasitic/auxiliary load. The controller 50 may determine battery output current ($i_{batt}$) based on one or more battery current signals, indicating current flow from the HV battery 18. Battery current sensors in the HEV 16 may provide the battery current signals. Furthermore, the battery current signals may be raw current signals processed by the controller 50 or may be embedded or encoded with data or information about the current flow relative to the HV battery 18.

At block 84, a parasitic/auxiliary load current ($i_{AUX}$) is determined. The parasitic/auxiliary load current ($i_{AUX}$) represents current branching off to various loads, such as Heating, Ventilating, and Air Conditioning (HVAC) 19 in the HEV 16. The controller 50 may determine or calculate the parasitic/auxiliary load current ($i_{AUX}$) based on known load characteristics of such parasitic/auxiliary loads 19 in the HEV 16.

At block 86, a reference current ($i_{ref}$) is determined. The reference current ($i_{ref}$) can be calculated as the difference between the measured or estimated battery output current ($\hat{i}_{batt}$) and the measured or estimated parasitic/auxiliary load current ($\hat{i}_{AUX}$). The controller may determine or calculate the reference current ($i_{ref}$).

At block 88, an error current ($i_{err}$) is determined. The error current ($i_{err}$) can be calculated as the difference between the reference current ($i_{ref}$) and estimated inductor current ($\hat{i}_L$), which may be an output from the logic portion depicted in FIG. 5. The controller 50 may determine or calculate the error current ($i_{err}$).

At block 90 of flowchart diagram 80, an output of the observer state-feedback controller ($x_{OPI}$) is determined. The output of the observer state-feedback controller ($x_{OPI}$) can be calculated as follows:

$$x_{OPI} = \left(b_0 + \frac{k_{so}}{s}\right)(i_{err}).$$

Gain parameters ($b_o$ and $k_{so}$) may typically be calculated as follows: $b_o = 2\pi(f_{bw})(\hat{L})$ and $k_{so} = 2\pi(f_{bw})(\hat{r}_L)$ where $f_{bw}$ is the desired closed-loop observer bandwidth. The controller may determine or calculate the output of the observer state-feedback controller ($x_{OPI}$).

At block 92, a proportional integral portion of inductor current ($\hat{i}_{LPI}$) is determined. The logic portion of block diagram 58 can determine the proportional integral portion of inductor current ($i_{LPI}$). The controller 50 can determine the $\hat{i}_{LPI}$ based on the output of the observer state-feedback controller 54 ($x_{OPI}$) and estimated parameters $\hat{L}$ and $\hat{r}_L$ of the inductor.

At block 94 of flowchart diagram 80, inductor voltage ($v_L$) is determined. The controller 50 may estimate the voltage across the inductor 12 based on an output from the circuit element 38. Alternatively, the controller 50 may calculate the estimated digital voltage level ($\hat{v}_L = \hat{v}_{in} - (d_{top} * v_{DC})$). Depending on the configuration of the DC-to-DC power converter system 14, the controller 50 may determine the estimated digital voltage level ($\hat{v}_L$) in combination with the output from the circuit element 38, which may be configured according to either FIG. 2 or 3.

At block 96, an open-loop portion of inductor current ($\hat{i}_{LO}$) is obtained. The controller 50 may obtain $\hat{i}_{LO}$ based on a circuit-based low pass filter (LPF) receiving a measured or estimated voltage across the inductor 12 ($\hat{v}_L$) and characterizing the physical behavior of the inductor 12 as $$\frac{v_{out}}{\hat{v}_L} = k \cdot \frac{1}{\hat{L} \cdot s + \hat{r}_L}.$$

The controller 50 can receive the open-loop portion of inductor current ($\hat{i}_{LO}$) from, for example, circuit element 38 shown in FIG. 1.

At block 98, estimated inductor current ($\hat{i}_L$) is determined. The estimated inductor current ($\hat{i}_L$) may be calculated as the sum of $\hat{i}_{LPI}$ and $\hat{i}_{LO}$. For example, the controller 50 may determine estimated inductor current ($\hat{i}_L$) as the sum of $\hat{i}_{LPI}$ and $\hat{i}_{LO}$. Based on the estimated inductor current ($\hat{i}_L$), the controller 50 may determines at least one operating characteristic associated with the inductor 12 in the power converter system 14. Recall, the operating characteristic associated with the inductor 12 may be inductor current ($i_L$) or another operating characteristic of the DC-to-DC power converter system 14 that is based on inductor current ($i_L$).

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention. While various embodiments may have been described as providing advantages or being preferred over other embodiments with respect to one or more desired characteristics, as one skilled in the art is aware, one or more characteristics may be compromised to achieve desired system attributes, which depend on the specific application and implementation. These attributes include, but are not limited to: cost, strength, durability, life cycle cost, packaging, size, serviceability, weight, manufacturability, ease of assembly, etc. The embodiments described herein as less desirable than other embodiments or prior art implementations with respect to one or more characteristics are not outside the scope of the disclosure and may be desirable for particular applications.

What is claimed:

1. A method of determining current through an inductor ($I_L$) in a power converter system inside a hybrid electric vehicle with an electric motor and a generator, the power converter system being connected between a traction battery and a direct current (DC) bus for driving the electric motor and the generator with electric power from the traction battery, the method comprising:
    determining battery output current ($i_{batt}$);
    determining a voltage across the inductor ($v_L$); and
    determining the current through the inductor ($i_L$) based on the battery output current ($i_{batt}$), and the voltage across the inductor ($v_L$), and an open loop observer emulating parameters of physical behavior of the inductor including parasitic resistance of the inductor ($\hat{r}_L$) and inductance of the inductor ($\hat{L}$).

2. The method of claim 1 wherein determining the current through the inductor ($i_L$) comprises determining the current based on feedback from an open-loop observer.

3. The method of claim 2 wherein the feedback from the open-loop observer is based on inductance of the inductor (L), parasitic resistance of the inductor ($r_L$) and the voltage across the inductor ($v_L$).

4. The method of claim 2 wherein determining the current through the inductor ($i_L$) comprises determining based on a difference between the reference current ($i_{ref}$) or battery output current ($i_{batt}$) and the feedback from the open-loop observer.

5. The method of claim 4 wherein determining the inductor current comprises determining the inductor current based on proportional integral control of the difference between the reference current ($i_{ref}$) or battery output current ($i_{batt}$) and the feedback from the open-loop observer.

6. The method of claim 5 wherein the proportional integral control is based on inductance of the inductor and parasitic resistance in the inductor.

7. The method of claim 4 wherein the battery output current ($i_{batt}$) is determined based on measuring current from the traction battery.

8. The method of claim 1 wherein the voltage across the inductor ($v_L$) is determined based on a measurement of voltage across the inductor, filtering the measurement with a low pass filter to obtain a filtered measurement, amplifying the filtered measurement to obtain an amplified measurement, and converting the amplified measurement to digital form.

9. The method of claim 8 wherein the measurement of voltage across the inductor is based on inductive coupling sensing of the inductor.

10. The method of claim 1 wherein the voltage across the inductor ($v_L$) is determined based on a voltage across a capacitor connected to the storage side of the power converter system ($v_{in}$), a duty cycle of a power switch in the power converter system ($d_{top}$), and a bus voltage ($v_{DC}$).

11. A method of determining at least one operating characteristic associated with an inductor in a power converter system with a storage side and a bus side, comprising:
    determining the operating characteristic based on current from the storage side ($i_{ref}$), at least one voltage parameter of the inductor obtained during operation of the power converter system, and an open loop observer emulating parameters of physical behavior of the inductor including parasitic resistance ($\hat{r}_L$) and inductance ($\hat{L}$).

12. The method of claim 11 wherein the operating characteristic associated with the inductor is current through the inductor ($i_L$).

13. The method of claim 11 further comprising sensing battery current ($i_{batt}$) from a storage battery connected to the storage side of the power converter system and determining the current from the storage side ($i_{ref}$) based on the battery current ($i_{batt}$) or the battery current and parasitic/auxiliary load current ($i_{AUX}$).

14. The method of claim 11 further comprising comparing estimated current through the inductor in a previous control loop ($\hat{i}_L$) with the current from the storage side ($i_{ref}$).

15. The method of claim 11 wherein the voltage parameter comprises inductor voltage.

16. The method of claim 15 further including measuring the voltage across the inductor to obtain the voltage parameter.

17. The method of claim 15 further including calculating the voltage across the inductor based on a voltage across a capacitor connected to the storage side of the power converter system ($v_{in}$), a duty cycle of a power switch in the power converter system ($d_{top}$), and a bus voltage ($v_{DC}$) to obtain the electrical non-current parameter.

18. A system for determining current through an inductor ($i_L$) in a power converter system connected between a battery and a direct current (DC) bus for driving an electric load, the system comprising:
    a logic device configured to determine a battery output current ($i_{batt}$), to determine a voltage across the inductor ($v_L$), and to determine the current through the inductor ($i_L$) based on the battery output current ($i_{batt}$) the voltage across the inductor ($v_L$), and an open loop observer emulating parameters of physical behavior of the inductor including parasitic resistance of the inductor ($\hat{r}_L$) and inductance of the inductor ($\hat{L}$); and wherein the power converter system is controlled based on the current through the inductor ($i_L$).

19. The system of claim 18 wherein the estimated current through the inductor ($\hat{i}_L$) is based on feedback from an open-loop observer.

20. The system of claim 19 wherein the feedback from the open-loop observer is based on the estimated inductance of the inductor ($\hat{L}$), the estimated parasitic resistance of the inductor ($\hat{r}_L$) and the measured or estimated voltage across the inductor ($\hat{v}_L$).

* * * * *